United States Patent
Sieben et al.

[11] Patent Number: 6,137,667
[45] Date of Patent: Oct. 24, 2000

[54] CIRCUIT AND METHOD FOR TRIGGERING AN OVER-VOLTAGE PROTECTION UNIT

[75] Inventors: Bernhard Sieben, Munich; Roland Krimmer, Germering; Ludwig Dirscherl, Munich, all of Germany

[73] Assignee: Siemens Aktiengesellschaft, Munich, Germany

[21] Appl. No.: 09/219,067

[22] Filed: Dec. 22, 1998

[30] Foreign Application Priority Data

Dec. 22, 1997 [DE] Germany ............... 197 57 365

[51] Int. Cl.[7] ................................................. H02H 3/20
[52] U.S. Cl. ................................. 361/91.1; 361/91.5
[58] Field of Search .................... 361/91.1, 91.5, 361/111, 113; 324/522, 713

[56] References Cited

U.S. PATENT DOCUMENTS 3,975,677  8/1976  Hancock ........................... 324/546

FOREIGN PATENT DOCUMENTS

PS 29 41 505  10/1987  Germany.
OS 44 17 129  11/1995  Germany.

*Primary Examiner*—Michael J. Sherry
*Attorney, Agent, or Firm*—Hill & Simpson

[57] ABSTRACT

In a circuit and method for triggering an over-voltage protection unit, a trigger voltage for an over-voltage protection unit is achieved either by a disconnection voltage of a coil or by a charge process of a capacitor. For feeding these reactances, a signal generator is used.

8 Claims, 3 Drawing Sheets

CIRCUIT AND METHOD FOR TRIGGERING AN OVER-VOLTAGE PROTECTION UNIT

BACKGROUND OF THE INVENTION

1. Field of the Invention

The present invention is directed to a circuit and method for triggering an over-voltage protection unit, the over-voltage protection unit being disposed in or on a module and being connected via at least one connection line between a signal input and a signal output of the module.

2. Description of the Prior Art

Over-voltage protection units are provided in modules, in particular subscriber terminal modules, in order to protect the active and passive elements of the module from destruction by interference voltages that are unavoidably fed in. These interference voltages can for example be high-voltage pulses (spikes) caused by lightning. Conventionally, a response of the over-voltage protection units on a module is tested with test voltage pulses from a pulse voltage generator. The evaluation of the test result takes place by subsequently conducting a functional test of the module, and, if warranted, evaluating signal curves recorded during the test voltage pulses at components of the module. This type of test for the response of the over-voltage protection unit, however, has the disadvantage that it is tedious and requires trained personnel for evaluation.

SUMMARY OF THE INVENTION

An object of the present invention is to provide a circuit arrangement and a method for triggering an over-voltage protection unit wherein the aforementioned problems associated with conventional circuits and testing techniques are avoided.

The above object is achieved in accordance with the principles of the present invention in a circuit and method for triggering an over-voltage protection unit, the over-voltage protection unit being of the type described above, wherein a trigger voltage for the over-voltage protection unit is achieved by appropriate switching of a reactance connected at signal outputs of the module. A signal generating unit for generating a test voltage is connected to the signal inputs. The reactance can either be an inductance, such as a coil, or a capacitance such as one or more capacitors, or an oscillating circuit containing a capacitance and an inductance.

Besides the advantage of a rapid and reliable diagnosis concerning the response of an over-voltage protection unit, the invention has the further advantage that the over-voltage test is automatized and economical.

The invention has the further advantage that no impulse voltage generator is required for the production of over-voltages.

The invention has the further advantage that by coupling a reactance to the signal outputs and feeding a signal voltage from a signal production unit, the over-voltage protection unit arranged on the module is caused to respond in a simple manner.

The invention has the further advantage that passive components are used for triggering the over-voltage protection.

DESCRIPTION OF THE PREFERRED EMBODIMENTS

Figure 1:
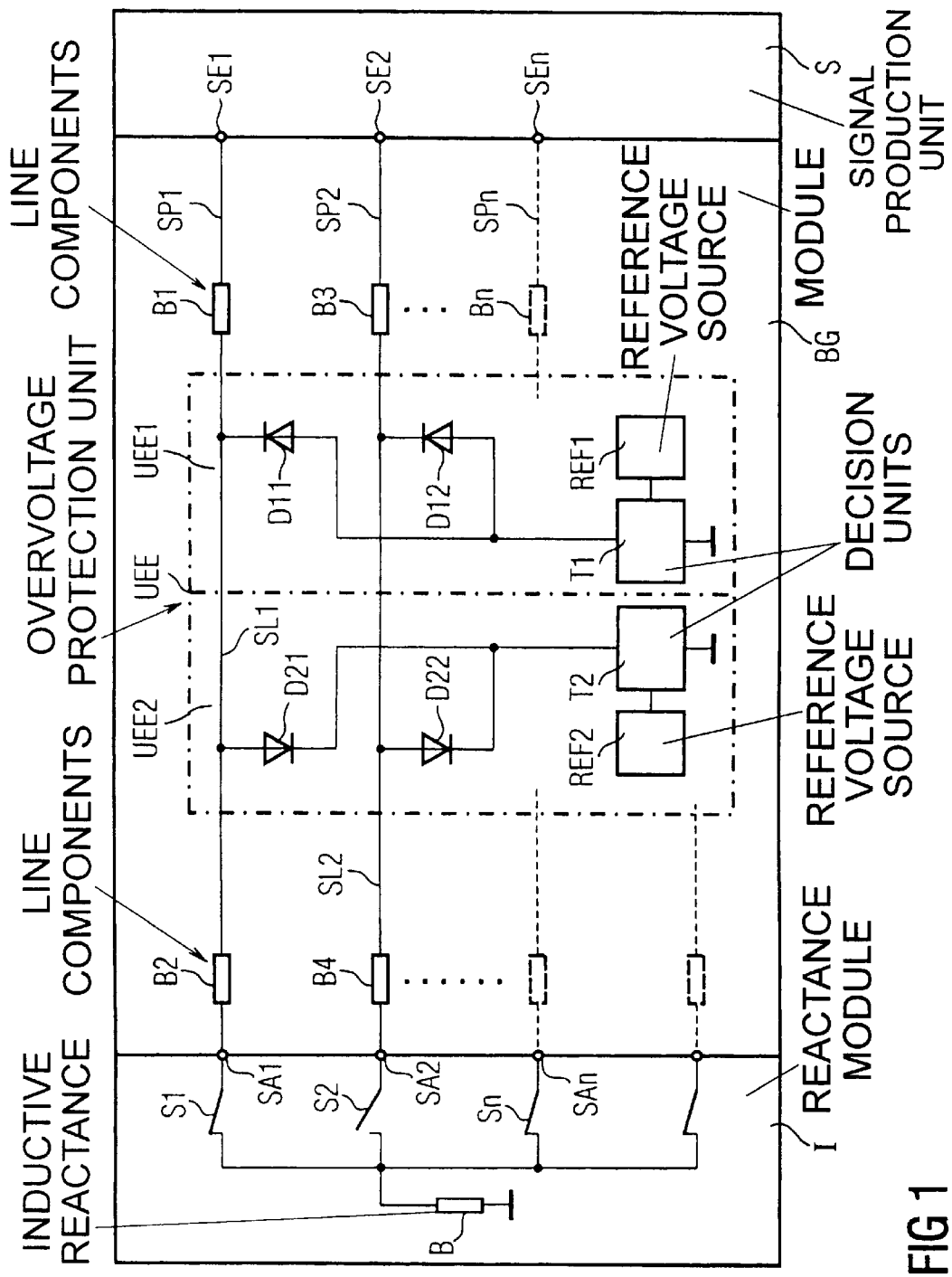
FIG. 1 shows a first embodiment of a circuit arrangement for testing an over-voltage protection unit in accordance with the invention.

FIG. 1 shows a module BG, in particular a subscriber terminal module, connected at its signal inputs SE1, SE2, SEn with at least one signal production unit S. This signal production unit S produces, for example, call and signal voltages, and during operation supplies at least one subscriber circuit (not shown), connected to the signal outputs SA1, SA2; SA3, SAn of the module BG, with a call voltage and a signal voltage or a feed voltage. In this circuit embodiment construction, for the over-voltage test an inductive reactance B is arranged at the signal output SA1, SAn of the module BG via controllable switches S1, Sn. In this embodiment, the controllable switches S1, S2, Sn and the inductive, reactance B are arranged in a separate module 1. In a further variant, the signal production unit S and the controllable switches Sn, as well as the inductive reactance B, can also be integrated on the module BG. The inductive reactance B, which can be for example a coil, is connected to signal outputs SA1, SAn of the module BG via the controllable switches S1, Sn. The omitted connection between the signal output SA2 and the controllable switch S2 is indicated only as an example. The triggered over-voltage protection unit is maintained in its triggered state with a current produced by the signal production unit S via the voltage path on the module BG, this voltage path being associated with the signal input SE2.

The over-voltage protection unit UEE arranged in the module BG includes a first unit UEE1 for monitoring a first voltage level that occurs on the voltage path SPn proceeding between the signal input SEn and the signal output SAn and a second unit UEE2 for monitoring a second such voltage level. The first unit UEE1 is formed by a number of first diodes D11 ... D1n corresponding to the number of voltage paths SPn, a first decision unit T1 and a first reference voltage source REF1. The second unit UEE2 is formed by a number of second diodes D21 ... D2n corresponding to the number of voltage paths SPn, a second decision unit T1 and a second reference voltage source REF2.

In the first unit UEE1, the cathode of the first diode D11 is connected with a line segment SL1 of the first voltage path SP1, and further line segments SLn of further voltage paths SPn are connected with the respective cathodes of the further first diodes D12 ... D1n. The anodes of the first diodes D1n are connected with each other and to the first decision unit T1. The first decision unit T1 is connected with the first reference voltage source REF1 for comparison of the first voltage level.

In the second unit UEE2, the anodes of the second diodes D21 ... D2n are connected with the cathodes of the first diodes D11 ... D1n, respectively. The cathodes of the second diodes D2n are connected with one another and with the second decision unit T2. The second reference voltage source REF2 for the predetermination of a second voltage level is connected with the second decision unit T2.

The first and second decision units T1 and T2 are each basically formed by a thyristor or a comparator. If the voltage level on the voltage paths SPn, which level is to be monitored at the input of the particular decision unit T1 or T2, exceeds the first or second voltage level predetermined by the first or second reference voltage source REF1, REF2, this excessive voltage is connected to ground potential, e.g. via the thyristor. The line segments SLn respectively connect components Bn of a voltage path SPn that are arranged on the module BG between the signal input SEn and a corresponding signal output SAn of the module BG.

In this embodiment, the signal outputs SA1, SA2, SAn are respectively connected with the inductive reactance B via controllable switches S1, S2, Sn. The controllable switches S1, S2, Sn each can be a relay or an electronic switch. For storing the trigger energy in the reactance B, this is connected, via at least one voltage path SPn, with a voltage across the output of the signal production unit S. If the signal input SE1, SE3, SEn becomes high-ohmic, or if the signal inputs SE1, SEn are separated from the signal production unit S, the electromagnetic energy in the reactance B produces a voltage pulse that is of opposite polarity relative to the previously supplied voltage. If the potential of the voltage pulse exceeds the potential predetermined by the first or second reference voltage REF1, REF2, the potential of the voltage pulse is drained to ground. By means of a logic unit integrated on the module BG, the response of the first unit UEE1 or the second unit UEE2 of the over-voltage protection unit UEE is recognized. The triggered over-voltage protection unit UEE is maintained via a voltage emitted by the signal production unit S.

In the following, the method steps for triggering the first unit UEE1 in the over-voltage protection unit UEE are described.

In a first method step, the signal inputs SE1, SE2, SEn are simultaneously supplied to the signal production unit S, which is formed from one or more high-voltage components, which are charged with a voltage and are connected to the signal outputs SA1, SAn via driveable switches S1, S3, Sn of the inductive reactance B. The current flowing through the inductive reactance B is thereby dimensioned in such a way that the disconnection current of the inductive reactance B is, for example, sufficient for the connection through of the thyristor arranged in the decision unit T1.

In a second method step, the voltage supply for the inductive reactance B is interrupted by the signal production unit S. The connected-through thyristor in the decision unit T1 is supplied with a voltage by the signal production unit S via the voltage path SP2. An evaluation logic unit (not shown) connected in the module BG or connected to the module BG, registers the forced tripping of the thyristor, and thereby the triggering of the first unit UEE.

Next, the method steps for the triggering of the second unit UEE2 of the over-voltage protection unit UEE are described.

The first method step in this triggering procedure corresponds to the aforementioned first method step for triggering the first unit UEE1 of the over-voltage protection unit UEE. However, the voltage potentials SP1, SPn at the signal production unit S have an inverted sign in this test.

In a second method step, the controllable switches S1, SPn, connected with the signal outputs SA1, SAn, are opened, except for a controllable switch S1, and the signal inputs SE1, SEn of the module BG that correspond to the opened switches S are switched to a high-ohmic state. After the response of the second unit UEE2, the switching state of the second unit UEE2 is maintained by means of a voltage emitted by the signal production unit S.

Figure 2:
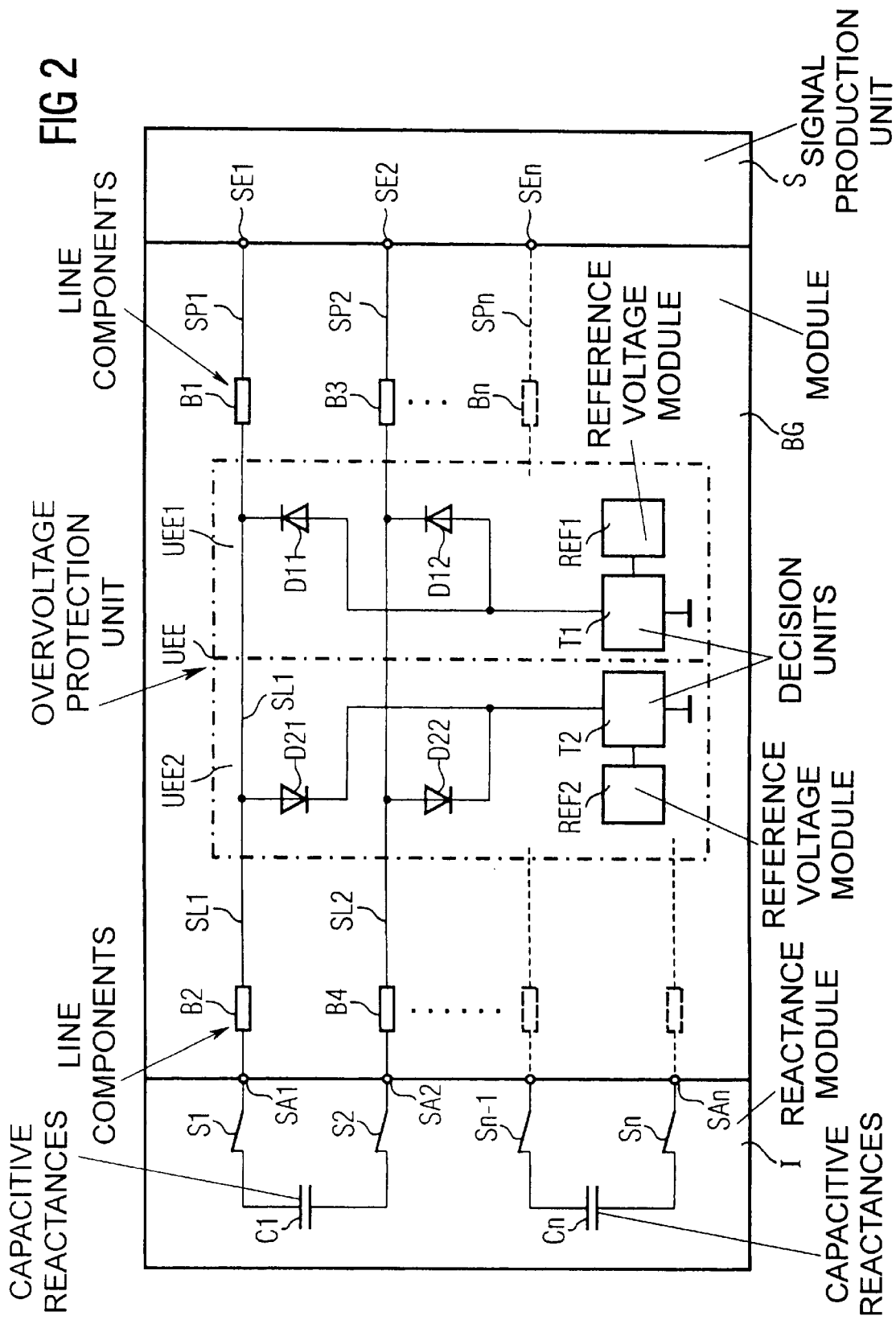
FIG. 2 shows a second embodiment of a circuit arrangement for testing an over-voltage protection unit in accordance with the invention.

FIG. 2 shows a further embodiment of a circuit arrangement for testing an over-voltage protection unit UEE arranged on a module BG.

In this embodiment, two signal outputs SA1, SA2; SA3, SAn of the module BG are respectively connected with capacitors C1, Cn collectively functioning as the aforementioned reactance. The respective electrodes of the capacitors C1, Cn are connected with the signal outputs SA1, SA2, SAn of the module BG via the controllable switches S1, S2, S3, Sn.

In a first method step, a first electrode of the capacitor Cn is charged to, for example, a first voltage of −60 volts via the first voltage path. After termination of the charging process, the signal input SE1 of the module BG is closed, for example by a high-ohmic resistance. In a second method step, the second electrode of the capacitor Cn is charged to a second potential corresponding having the same polarity as the first potential. Due to the shift of potential, the charge shifts to the first electrode of the capacitor Cn and the first unit UEE1 of the over-voltage protection unit UEE responds.

The second unit UEE2 of the over-voltage protection unit can be caused to respond by a reversal of the first and second potentials, corresponding to the previously described method steps.

Figure 3:
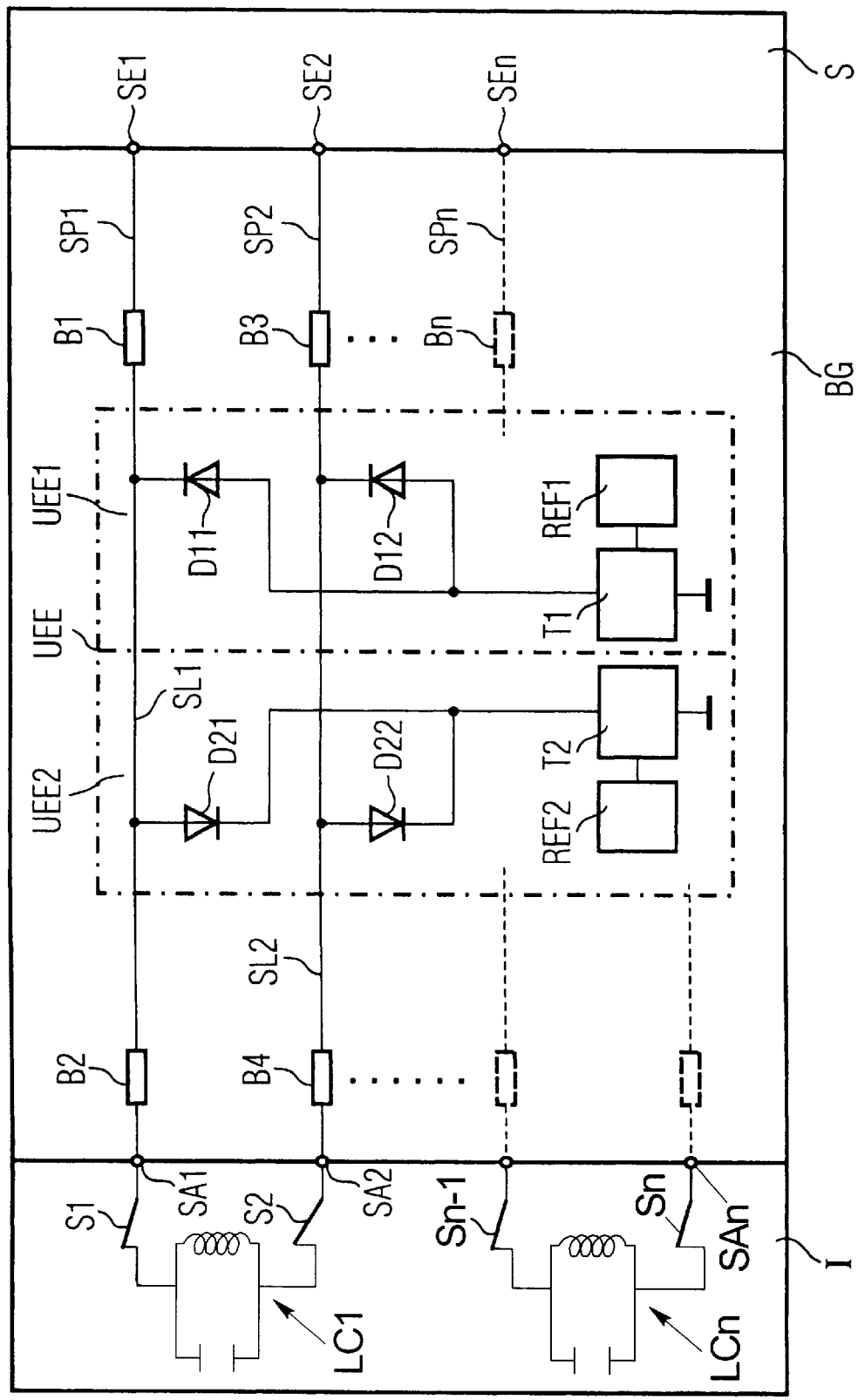
FIG. 3 shows a third embodiment of a circuit arrangement for testing an over-voltage protection unit in accordance with the invention.

FIG. 3 shows a further embodiment in accordance with the invention wherein the aforementioned reactance is formed by oscillating circuits LC1, LCn. Operation is similar to that described above in connection with the embodiment of FIG. 2.

Although modifications and changes may be suggested by those skilled in the art, it is the intention of the inventors to embody within the patent warranted hereon all changes and modifications as reasonably and properly come within the scope of their contribution to the art.

We claim as our invention:

1. A circuit for use with a module having a signal input and a signal output and a signal path proceeding in said module between said signal input and said signal output, said circuit comprising:

a triggerable over-voltage protection unit connected in said signal path;

a signal production unit comprising a call and signaling unit for producing at least one voltage, connected to said signal input; and a reactance connectable to said signal output for producing a triggering voltage for triggering said over-voltage protection unit.

2. A circuit as claimed in claim 1 wherein said reactance comprises an inductance.

3. A circuit as claimed in claim 1 wherein said module comprises two signal outputs, and wherein said reactance comprises a capacitance connected across said two signal outputs.

4. A circuit as claimed in claim 1 wherein said reactance comprises an oscillating circuit containing a capacitance and an inductance.

5. A circuit as claimed in claim 1 wherein said signal production unit comprises a feed circuit.

6. A circuit as claimed in claim 1 wherein said over-voltage protection unit comprises:

a first unit for monitoring whether a voltage on said signal path exceeds a first voltage level and, if said first voltage level is exceeded, for applying said voltage on said signal path to ground; and a second unit for monitoring whether a voltage on said signal path exceeds a second voltage level, different from said first voltage level, and if said second voltage level is exceeded, for connecting said voltage on said signal path to ground.

7. A method for protecting a module from over-voltage, said module having a plurality of signal inputs and a plurality of signal outputs, said method comprising the steps of:

connecting a triggerable over-voltage protection unit in a signal path between one of said signal inputs and one of said signal outputs;

connecting an inductive reactance to said one of said signal outputs through a controllable switch and operating said controllable switch to apply a potential to said one of said signal outputs;

simultaneously placing said signal inputs at a high-ohmic state, except for said one signal input, and dimensioning the potential applied to said inductive reactance so that a voltage produced after disconnecting said inductive reactance by operating said controllable switch triggers said over-voltage protection unit; and maintaining said over-voltage unit in a triggered state, after triggering thereof by said voltage produced by disconnection of said inductive reactance, by supplying a current to said over-voltage protection unit from a signal production unit.

8. A method for protecting a module from over-voltage, said module having a plurality of signal inputs and a plurality of signal outputs, said method comprising the steps of:

connecting a triggerable over-voltage protection unit in two signal paths respectively proceeding between two of said signal inputs and two of said signal outputs;

connecting a capacitive reactance across said two of said signal outputs through controllable switches, said capacitive reactance having a first electrode and a second electrode;

charging said first electrode of said capacitive reactance, with said controllable switches closed, to a voltage level;

charging said second electrode of said capacitive reactance to said voltage level and maintaining a difference between a potential at said first electrode and a potential at said second electrode, and triggering said over-voltage protection unit with said potential at said first electrode.

* * * * *